(12) United States Patent
Kondo et al.

(10) Patent No.: US 10,558,171 B2
(45) Date of Patent: Feb. 11, 2020

(54) TIME MEASURING CIRCUITRY AND DISTANCE MEASURING APPARATUS

(71) Applicant: KABUSHIKI KAISHA TOSHIBA, Tokyo (JP)

(72) Inventors: Satoshi Kondo, Kanagawa (JP); Akihide Sai, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 336 days.

(21) Appl. No.: 15/705,699

(22) Filed: Sep. 15, 2017

(65) Prior Publication Data
US 2018/0267481 A1 Sep. 20, 2018

(30) Foreign Application Priority Data

Mar. 17, 2017 (JP) ................... 2017-053674

(51) Int. Cl.
*G04F 10/00* (2006.01)
*H03L 7/099* (2006.01)
(Continued)

(52) U.S. Cl.
CPC ............ *G04F 10/005* (2013.01); *G01S 13/10* (2013.01); *H03L 7/091* (2013.01); *H03L 7/0991* (2013.01); *H03L 7/0997* (2013.01); *G01S 15/10* (2013.01); *G01S 17/10* (2013.01); *H03K 3/84* (2013.01); *H03L 2207/50* (2013.01)

(58) Field of Classification Search
CPC ....... G04F 10/00; H03M 3/388; G01S 7/4911
See application file for complete search history.

(56) References Cited

U.S. PATENT DOCUMENTS 5,999,586 A 12/1999 Terada et al.
6,754,613 B2 * 6/2004 Tabatabaei .............. G04F 10/00
702/189

(Continued)

FOREIGN PATENT DOCUMENTS

JP 3195556 6/2001

OTHER PUBLICATIONS

Henzler et al., "A Local Passive Time Interpolation Concept for Variation-Tolerant High-Resolution Time-to-Digital Conversion", IEEE Journal of Solid-State Circuits, vol. 43, No. 7, Jul. 2008 (pp. 1666-1676).

*Primary Examiner* — Bernarr E Gregory
(74) *Attorney, Agent, or Firm* — Nixon & Vanderhye, P.C.

(57) ABSTRACT

Time measuring circuitry has a ring oscillator, a time-to-digital converter, a time measurer and a phase randomizer. The ring oscillator has a plurality of delay circuitries connected in a ring shape, the ring oscillator adjusting delay times of the plurality of delay circuitries based on an oscillation control signal to generate an oscillation signal. The time-to-digital converter quantizes a phase of the oscillation signal at a transition timing of a reference signal. The phase synchronizing circuitry to generate the oscillation control signal based on an output signal of the time-to-digital converter so that a phase of the oscillation signal coincides with a phase of the reference signal. The time measurer to measure a time interval based on the output signal of the time-to-digital converter. The phase randomizer to randomly shift the phase of the oscillation signal to be locked by the phase synchronizing circuitry.

18 Claims, 5 Drawing Sheets

(51) Int. Cl.
*H03L 7/091* (2006.01)
*G01S 13/10* (2006.01)
*G01S 15/10* (2006.01)
*G01S 17/10* (2006.01)
*H03K 3/84* (2006.01)
*G01S 13/00* (2006.01)

(56) References Cited

U.S. PATENT DOCUMENTS

| | | | | |
|---|---|---|---|---|
| 6,859,744 B2* | 2/2005 | Giger | ............... | G01S 7/4911 331/57 |
| 7,332,973 B2* | 2/2008 | Lee | ............... | G04F 10/005 327/12 |
| 7,940,099 B2 | 5/2011 | Weltin-Wu et al. | | |
| 8,542,138 B2* | 9/2013 | Galton | ............... | H03M 3/388 341/118 |
| 8,773,182 B1* | 7/2014 | Degani | ............... | G04F 10/005 327/147 |
| 8,786,474 B1* | 7/2014 | Mann | ............... | G04F 10/005 250/361 R |
| 8,797,079 B2* | 8/2014 | Schimper | ............... | H03K 3/0322 327/261 |
| 8,896,477 B2* | 11/2014 | Dosho | ............... | G04F 10/005 341/166 |
| 8,907,710 B2* | 12/2014 | Xu | ............... | H03K 3/0322 327/266 |
| 9,092,013 B2* | 7/2015 | Song | ............... | G04F 10/005 |
| 9,104,181 B1* | 8/2015 | Jung | ............... | G04F 10/005 |
| 9,197,402 B2* | 11/2015 | Kim | ............... | G04F 10/005 |
| 2005/0259239 A1* | 11/2005 | Lin | ............... | G01S 7/285 356/5.01 |
| 2008/0069292 A1* | 3/2008 | Straayer | ............... | G04F 10/005 377/46 |

\* cited by examiner

TIME MEASURING CIRCUITRY AND DISTANCE MEASURING APPARATUS

CROSS REFERENCE TO RELATED APPLICATIONS

This application is based upon and claims the benefit of priority from the prior Japanese Patent Application No. 2017-53674, filed on Mar. 17, 2017, the entire contents of which are incorporated herein by reference.

FIELD

Embodiments relate to time measuring circuitry and a distance measuring apparatus.

BACKGROUND

There has been proposed time measuring circuitry in which outputs of inverters in a ring oscillator are held by a flip-flop train at a predetermined input timing and performs time measurement by using the held data.

However, for the inverters in the ring oscillator, the delay time is not constant due to device variation or the like, so that linearity of the time measuring circuitry becomes worse. In order to improve the linearity of the time measuring circuitry, it is required to perform PLL control, resulting in complicated circuitry. Even if the PLL control is performed, a certain degree of nonlinearity inevitably remains.

DETAILED DESCRIPTION

According to one embodiment of a time measuring circuitry has a ring oscillator, a time-to-digital converter, a time measurer and a phase randomizer. The ring oscillator has a plurality of delay circuitries connected in a ring shape, the ring oscillator adjusting delay times of the plurality of delay circuitries based on an oscillation control signal to generate an oscillation signal. The time-to-digital converter quantizes a phase of the oscillation signal at a transition timing of a reference signal. The phase synchronizing circuitry generates the oscillation control signal based on an output signal of the time-to-digital converter so that a phase of the oscillation signal coincides with a phase of the reference signal. The time measurer measures a time interval based on the output signal of the time-to-digital converter. The phase randomizer randomly shifts the phase of the oscillation signal to be locked by the phase synchronizing circuitry.

Hereinafter, an embodiment of the present disclosure will be explained with reference to the drawings. In the accompanying drawings of the present specification, for simplicity of drawings and easy understanding, the scale, the ratio of height to width, etc. are appropriately modified or enlarged from actual ones.

Shapes and geometrical conditions, and also their degrees used in this specification are defined. For example, the terms such as "parallel", "orthogonal" and "the same", the values of length and angle, etc. are, not to be limited to the strict sense of the terms, but interpreted to such an extent that a similar function can be expected.

Figure 1:
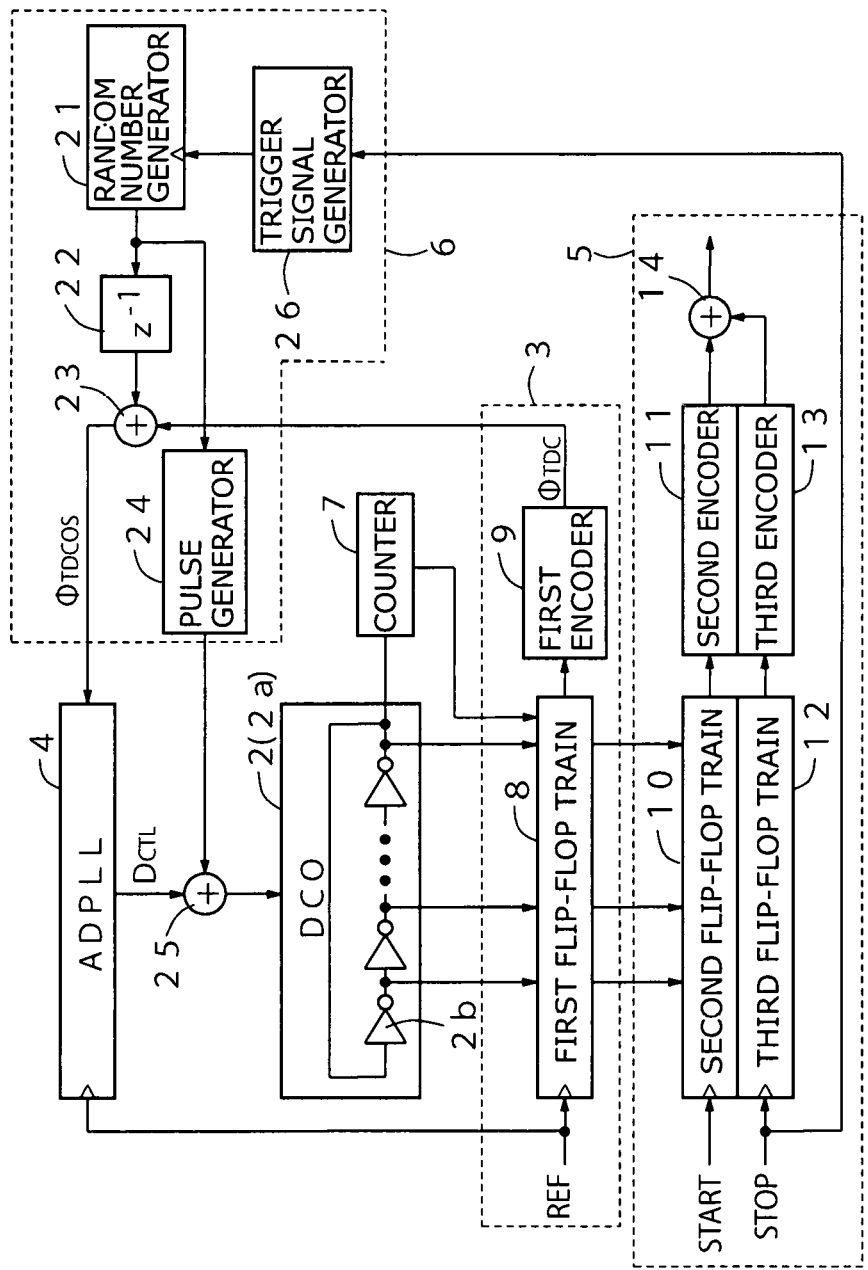
FIG. 1 is a block diagram of time measuring circuitry according to an embodiment.

FIG. 1 is a block diagram of time measuring circuitry 1 according to an embodiment. The time measuring circuitry 1 of FIG. 1 is provided with a digitally-controlled oscillator (DCO) 2, a time-to-digital converter (TDC) 3, phase synchronizing circuitry (ADPLL: All Digital Phase-Locked Loop) 4, a time measurer 5, and a phase randomizer 6.

The DCO 2 has a ring oscillator 2a. The ring oscillator 2a has a plurality of delay circuitries (for example, inverters) 2b connected in a ring shape, which adjusts delay times of the delay circuitries 2b based on an oscillation control signal to generate an oscillation signal. A counter 7 is connected to the ring oscillator 2a. The counter 7 performs a counting operation in synchronism with the oscillation signal output from the ring oscillator 2a. The operation of the counter 7 corresponds to detection of an integer phase in view of ADPLL control.

The TDC 3 outputs data ϕTDC acquired by quantizing the phase of the oscillation signal at a transition timing of a reference signal REF. The phase synchronizing circuitry 4 generates an oscillation control signal based on the output signal ϕTDC of the TDC 3 so that the phase of the oscillation signal coincides with the phase of the reference signal REF.

The TDC 3 has a first flip-flop train (first hold circuitry train) 8 having a plurality of flip-flops that hold the outputs of the respective delay circuitries 2b in the ring oscillator 2a, and has a first encoder 9. The respective flip-flops in the first flip-flop train 8 hold the outputs of the respective delay circuitries 2b at the same timing in synchronism with the reference signal REF. The first flip-flop train 8 also includes a flip-flop that holds a count value of the counter 7. The first encoder 9 generates data acquired by encoding data held by the respective flip-flops in the first flip-flop train 8. The data encoded by the first encoder 9 becomes the data ϕTDC acquired by quantizing the phase of the oscillation signal.

The time measurer 5 measures a time interval based on the quantized data ϕTDC output from the TDC 3. The time measurer 5 has a second flip-flop train (second hold circuitry train) 10, a second encoder 11, a third flip-flop train (third hold circuitry train) 12, a third encoder 13, and a first adder (time interval arithmetic unit) 14. The second flip-flop train 10 has a plurality of flip-flops that hold the outputs of the respective flip-flops in the first flip-flop train 8 at the same timing in synchronism with a first input signal START. The third flip-flop train 12 has a plurality of flip-flops that hold the outputs of the respective flip-flops in the first flip-flop train 8 at the same timing in synchronism with a second input signal STOP. As described above, the second flip-flop train 10 and the third flip-flop train 12 hold the output signal of the first flip-flop train 8 in synchronism with the first input signal START and the second input signal STOP, respectively, different from each other. The first input signal START is a signal indicating the start of time measurement. The second input signal STOP is a signal indicating the completion of the time measurement.

The data held by each flip-flop in the second flip-flop train 10 is encoded by the second encoder 11. The data held by each flip-flop in the third flip-flop train 12 is encoded by the third encoder 13. The first adder 14 computes differential data between the data encoded by the second encoder 11 and the data encoded by the third encoder 13. The differential data is time measurement data corresponding to data acquired by quantizing a time difference from the time of inputting the first input signal START to the time of inputting the second input signal STOP.

The phase randomizer 6 randomly shifts the phase of the oscillation signal to be locked by the phase synchronizing circuitry 4. The phase randomizer 6 has a random number generator 21, a delay circuitry 22, a second adder 23, a pulse generator 24, a third adder (oscillation control randomizer) 25, and a trigger signal generator 26.

The random number generator 21 generates random numbers. The 1 LSB of each random number corresponds to the 1 LSB of the phase of the oscillation signal. The random numbers generated by the random number generator 21 may not only be random numbers in the strict sense but may also be pseudo-random numbers generated by using generating polynomials or the like. The concept of random numbers in the present embodiment includes highly random codes such as pseudo-random numbers.

The delay circuitry 22 delays the timing at which the output data ϕTDC of the TDC 3 is randomized with a random number generated by the random number generator 21. The second adder 23 adds the output data ϕTDC of the TDC 3 and a random number delayed by the delay circuitry 22 to generate data ϕTDCOS that is acquired by adding an offset in accordance with the random number to the output data ϕTDC of the TDC 3, and supplies the data ϕTDCOS to the phase synchronizing circuitry 4.

When the random number generator 21 updates the random number, the pulse generator 24 generates a pulse signal in accordance with the random number. The third adder 25 generates a signal acquired by adding the pulse signal to the oscillation control signal output from the phase synchronizing circuitry 4. With the pulse signal, it is expected that a phase response speed of the phase synchronizing circuitry 4 is improved when shifting the phase of an oscillation signal to be locked in accordance with the random number. In other words, by temporally adding an offset to a frequency, it is possible to forcefully rotate the phase and hence to shift the phase of the oscillation signal at high speeds.

The trigger signal generator 26 generates a trigger signal in synchronism with an input timing of the second input signal STOP. The random number generator 21 generates the random number in synchronism with the trigger signal. The trigger signal generator 26 may generate the trigger signal in synchronism with the reference signal REF.

Figure 2:
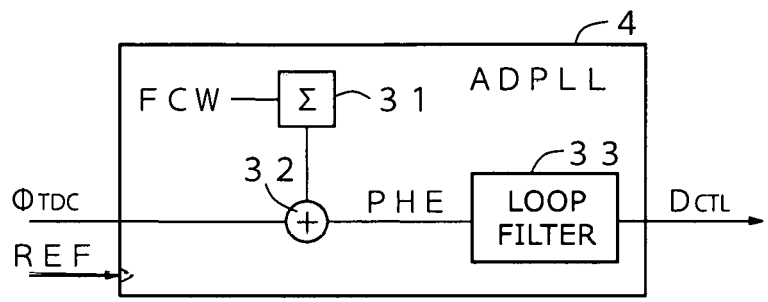
FIG. 2 is a block diagram showing an example of the internal configuration of phase synchronizing circuitry of FIG. 1.

FIG. 2 is a block diagram showing an example of the internal configuration of the phase synchronizing circuitry 4 of FIG. 1. The phase synchronizing circuitry 4 of FIG. 2 has a reference phase generator 31, a fourth adder 32, and a loop filter 33. The reference phase generator 31 generates a reference phase based on a frequency code signal FCW that expresses a desired frequency division ratio. The fourth adder 32 computes a difference between the output ϕTDCOS of the second adder 23 and the reference phase. The difference is a phase error signal PHE. The loop filter 33 is a low-pass filter that removes unnecessary high-band frequency components from the phase error signal PHE. An output signal of the loop filter 33 is an oscillation control signal $D_{CTL}$ that is input to the third adder 25. With the configuration of FIG. 2, the phase synchronizing circuitry 4 stabilizes the oscillation signal at a desired frequency.

Figure 3A:
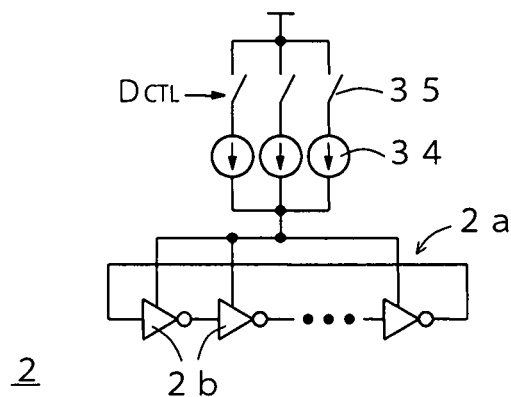
FIG. 3A is a block diagram showing a first example of a DCO internal configuration.

FIG. 3A is a block diagram showing a first example of the internal configuration of the DCO 2. The DCO 2 of FIG. 3A has a ring oscillator 2a having a plurality of delay circuitries 2b connected in a ring shape, a plurality of current sources 34 each for adjusting a delay time of each delay circuitry 2b in the ring oscillator 2a, and a switch 35 for switching between operation and non-operation of the current sources 34. The switch 35 switches between operation and non-operation of at least one of the current sources 34, based on an output signal of the third adder 25.

Figure 3B:
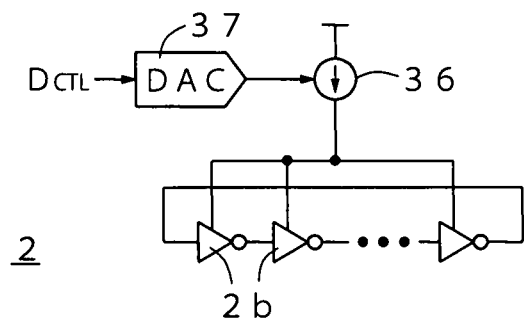
FIG. 3B is a block diagram showing a second example of the DCO internal configuration.

FIG. 3B is a block diagram showing a second example of the internal configuration of the DCO 2. The DCO 2 of FIG. 3B has a ring oscillator 2a having a plurality of delay circuitries 2b connected in a ring shape, and a variable current source 36 for adjusting a delay time of each delay circuitry 2b in the ring oscillator 2a. The variable current source 36 adjusts a current to feed, based on a signal acquired by converting, in analog conversion, an output signal $D_{CTL}$ of the phase synchronizing circuitry 4 by a D/A converter (DAC) 37.

FIG. 3A and FIG. 3B show just examples, so that the DCO 2 may have a different configuration from those of the FIG. 3A and FIG. 3B.

Figure 4:
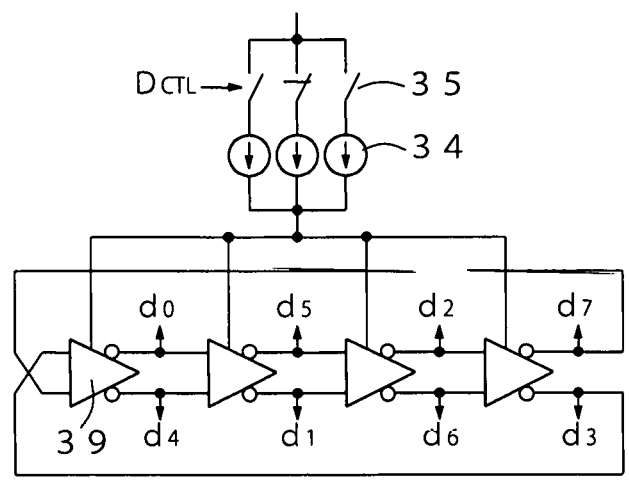
FIG. 4 is a circuit diagram showing an example of the practical configuration of a ring oscillator.

FIG. 4 is a circuit diagram showing an example of the practical configuration of the ring oscillator 2a. The ring oscillator 2a of FIG. 4 is an 8-phase differential ring oscillator 38. The differential ring oscillator 38 of FIG. 4 has four differential delay circuitries 39 connected in a ring shape, which generate phase outputs d0 to d7 having 8-level resolution to one cycle of the oscillation signal of the DCO 2.

Figure 5:
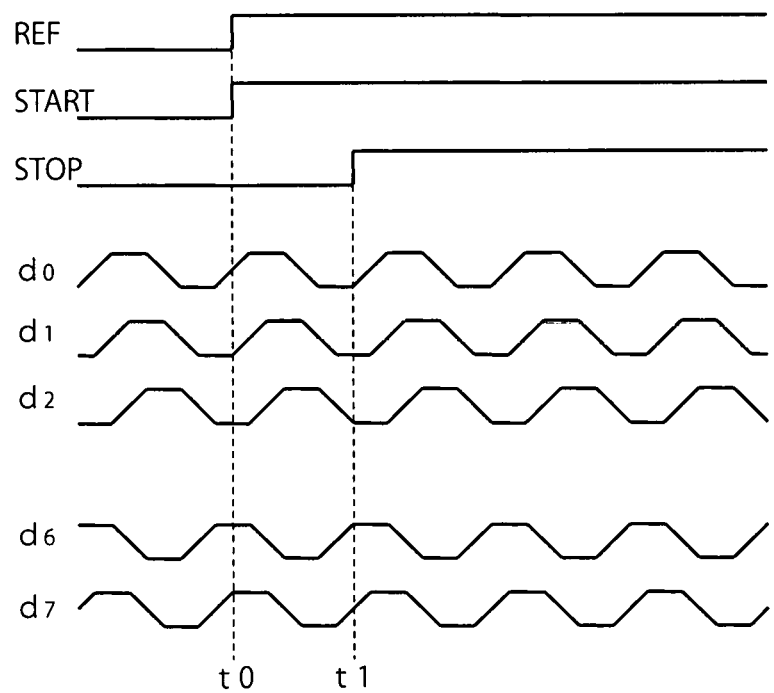
FIG. 5 is an operation timing chart of the time measuring circuitry of FIG. 1.

FIG. 5 is an operation timing chart of the time measuring circuitry 1 of FIG. 1, showing an example in which both of the reference signal REF and the first input signal START rise at time t0. The reference signal REF and the first input signal START may not necessarily show signal transition at the same timing. Outputs d0 to d7 of the respective delay circuitries 22 in the ring oscillator 6a vary while being shifted in succession. The time measurement data becomes 7 with the output d7 rising, at time t1.

Figure 6:
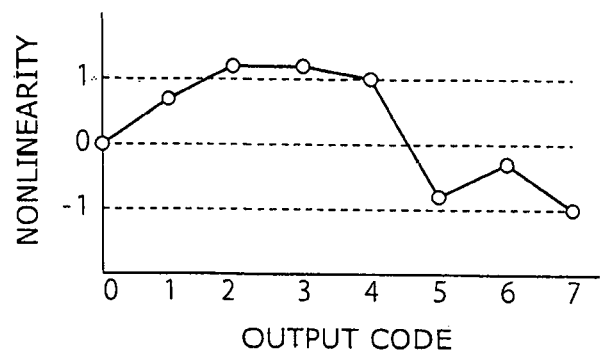
FIG. 6 is a diagram showing the corresponding relationship between the outputs of respective delay circuitries in a DCO 2 and DCO nonlinearity.

FIG. 6 is an illustration showing the corresponding relationship between the outputs d0 to d7 of the respective delay circuitries 22 in the DCO 2 and nonlinearity of the DCO 2. FIG. 6 shows an example in which the phase synchronizing circuitry 4 performs ADPLL control to lock the output d0 corresponding to a phase zero, the nonlinearity being zero for the output d0, but showing a big change for the outputs d1 to d7.

The DCO 2 shows the nonlinearity due to variation in electrical characteristics and circuit mismatching of the delay circuitries 22 that configure the DCO 2, and the like. In more detail, the DCO 2 shows the nonlinearity due not only to the variation in electrical characteristics and circuit mismatching of the delay circuitries 22 in the DCO 2, but also several kinds of non-ideality of circuitry, such as, variation in electrical characteristics of wiring resistance, capacitance, etc., and circuit mismatching, around the DCO 2, mismatching of the first flip-flop train 8, etc.

As discussed above, if the DCO 2 is nonlinear, and if the time measuring period is the same, measurement errors in the time measurement data are always at the same degree, lowering the measurement accuracy.

On the contrary, in the time measuring circuitry 1 according to the present embodiment, for each time measurement, the random number generator 21 generates a random number to randomize the output signal ϕTDC of the TDC 3. Therefore, even if the time measuring period is the same, there are no same measurement errors in the time measurement data.

Figure 7:
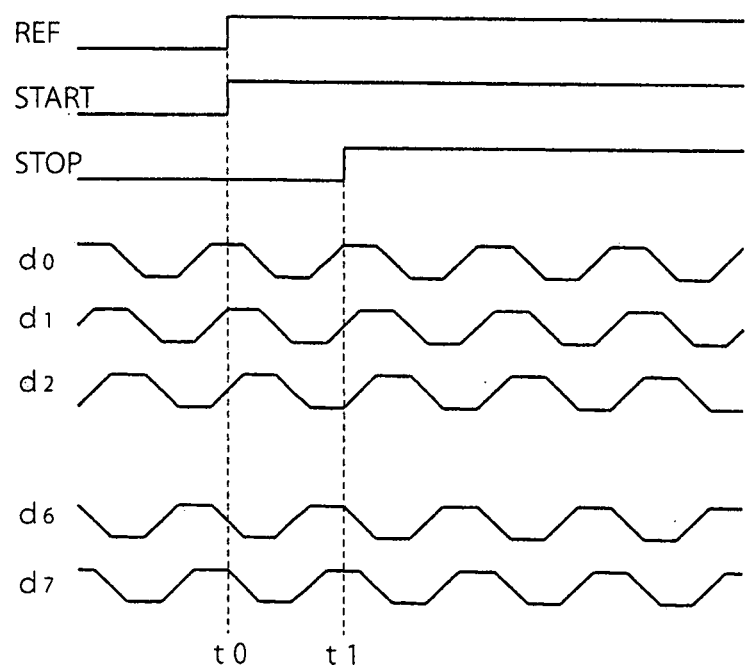
FIG. 7 is an operation timing chart of each waveform of phase outputs of FIG. 5 shifted to the left by two steps.
Figure 8:
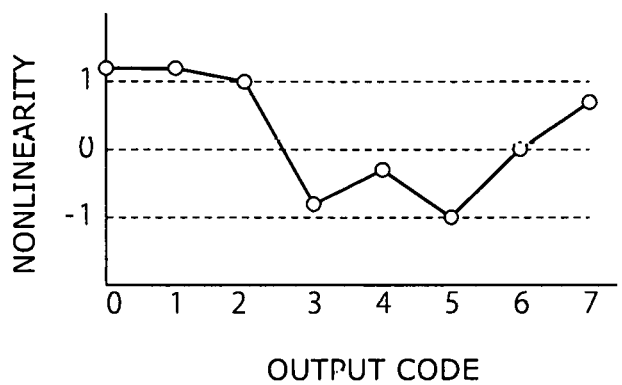
FIG. 8 is a diagram of each plot of FIG. 6 shifted to the left by two steps.

For example, if the random number generator 21 generates a random number of −2, a signal ϕTDCOS acquired by adding −2 to the output signal ϕTDC of the TDC 3 is fed back to the phase synchronizing circuitry 4. The phase synchronizing circuitry 4 performs ADPLL control so that the phase of the oscillation signal of the DCO 2 and the phase of the reference signal REF coincide with each other. Therefore, to the phase outputs of d0 to d7 of the DCO 2, a quantity corresponding to +2LSB is offset to cancel −2LSB offset. This is, as shown in FIG. 7, equivalent to the shift in waveforms of the phase outputs of d0 to d7 of FIG. 5 to the left by two steps and, as shown in FIG. 8, equivalent to the shift in plots of FIG. 6 to the left by two steps.

As described above, the time measuring circuitry 1 according to the present embodiment generates a new random number for each 1-time time measurement to generate the signal ϕTDCOS acquired by randomizing the output signal ϕTDC of the TDC 3 and, based on the signal ϕTDCOS, generates an oscillation control signal. In this way, the nonlinearity of the DCO 2 is dispersed without being uniform. By repeating the time measurement described above, the nonlinearity of the DCO 2 is cancelled out to improve the linearity of the DCO 2.

Figure 9:
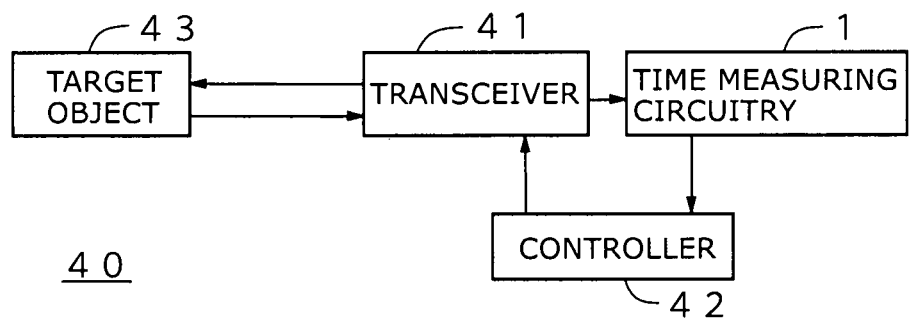
FIG. 9 is a block diagram schematically showing the configuration of a distance measuring apparatus provided with the time measuring circuitry of FIG. 1.

The time measuring circuitry 1 according to the present embodiment can be applied to a variety of purposes and usages. FIG. 9 is a block diagram schematically showing the configuration of a distance measuring apparatus provided with the time measuring circuitry 1 of FIG. 1. The distance measuring apparatus of FIG. 9 detects the distance to a target object in a non-contact manner, which is referred to as a displacement sensor, a distance sensor, etc.

A distance measuring apparatus 40 of FIG. 9 is provided with a transceiver 41, time measuring circuitry 1 having the same configuration as in FIG. 1, and a controller 42. The transceiver 41 transmits an electromagnetic wave signal or a sound wave signal toward a target object 43 and receives a reflected signal from the target object 43. The electromagnetic wave signal may be an optical signal of any frequency band, such as, ultraviolet rays, visible rays, and infrared rays. A sound wave signal of any frequencies may also be used.

The time measuring circuitry 1 of FIG. 9 measures time measurement data, with a signal transmitted by the transceiver 41 to the target object 43, as the first input signal START, and a reflected signal from the target object 43 received by the transceiver 41, as the second input signal STOP.

The controller 42 controls the transceiver 41 and the time measuring circuitry 1. In more detail, the controller 42 acquires the time measurement data measured by the time measuring circuitry 1 to measure a distance to the target object 43 based on frequencies of the signals transmitted and received by the transceiver 41 and on the time measurement data.

The distance measured by the distance measuring apparatus 40 of FIG. 9 can be used for a variety of purposes. Especially, in the present embodiment, since the distance to the target object 43 can be detected in succession at high speeds, the application to autonomous cars becomes easy, for example.

At least part of the time measuring circuitry and the distance measuring apparatus explained in the embodiment may be configured with hardware or software. When it is configured with software, a program that performs at least part of the time measuring circuitry and the distance measuring apparatus may be stored in a storage medium such as a flexible disk and CD-ROM, and then installed in a computer to run thereon. The storage medium may not be limited to a detachable one such as a magnetic disk and an optical disk but may be a standalone type such as a hard disk and a memory.

Moreover, a program that achieves the function of at least part of the time measuring circuitry and the distance measuring apparatus may be distributed via a communication network a (including wireless communication) such as the Internet. The program may also be distributed via an online network such as the Internet or a wireless network, or stored in a storage medium and distributed under the condition that the program is encrypted, modulated or compressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. Time measuring circuitry comprising:
a ring oscillator comprising a plurality of delay circuitries connected in a ring shape, the ring oscillator adjusting delay times of the plurality of delay circuitries based on an oscillation control signal to generate an oscillation signal;
a time-to-digital converter to quantize a phase of the oscillation signal at a transition timing of a reference signal;
phase synchronizing circuitry to generate the oscillation control signal based on an output signal of the time-to-digital converter so that a phase of the oscillation signal coincides with a phase of the reference signal;
a time measurer to measure a time interval based on the output signal of the time-to-digital converter; and
a phase randomizer to randomly shift the phase of the oscillation signal to be locked by the phase synchronizing circuitry.

2. The time measuring circuitry of claim 1, wherein the phase randomizer randomly shifts the phase of the oscillation signal to be locked by the phase synchronizing circuitry, whenever the time measurer measures the time interval.

3. The time measuring circuitry of claim 1, wherein the phase randomizer comprises a random number generator to generate a random number,
wherein the phase synchronizing circuitry generates the oscillation control signal based on a signal acquired by randomizing the output signal of the time-to-digital converter with the random number.

4. The time measuring circuitry of claim 3 further comprising:

a pulse generator to generate a pulse signal having a pulse height in accordance with a value of the random number: and an oscillation control randomizer to add an offset in accordance with the random number to the oscillation control signal based on the pulse signal, wherein the ring oscillator controls the phase of the oscillation signal based on the randomized oscillation control signal.

5. The time measuring circuitry of claim 3, wherein the time-to-digital converter comprises:

a first hold circuitry train comprising a plurality of first hold circuitry to hold outputs of the plurality of delay circuitries in the ring oscillator in synchronism with the reference signal; and an encoder to encode a signal train held by the plurality of first hold circuitry, wherein the phase randomizer generates the oscillation control signal based on a signal acquired by randomizing an output signal of the encoder with the random number.

6. The time measuring circuitry of claim 3, wherein the time measurer comprises:

a second hold circuitry train comprising a plurality of second hold circuitry to hold outputs of the plurality of delay circuitries in the ring oscillator in synchronism with a first input signal;

a third hold circuitry train comprising a plurality of third hold circuitry to hold the outputs of the plurality of delay circuitries in the ring oscillator in synchronism with a second input signal; and a time interval arithmetic unit to compute a difference between data acquired by encoding a signal train held by the plurality of second hold circuitry and data acquired by encoding a signal train held by the plurality of third hold circuitry, as the time interval.

7. The time measuring circuitry of claim 6, wherein the first input signal is a signal in synchronism with the reference signal and the second input signal is a signal indicating completion of measurement of the time interval.

8. The time measuring circuitry of claim 6 further comprising a trigger signal generator to generate a trigger signal in synchronism with an input timing of the second input signal, wherein the phase randomizer randomly varies the output signal of the time-to-digital converter in synchronism with a generation timing of the trigger signal.

9. The time measuring circuitry of claim 6 further comprising a trigger signal generator to generate a trigger signal in synchronism with the reference signal, wherein the phase randomizer randomly varies the output signal of the time-to-digital converter in synchronism with a generation timing of the trigger signal.

10. A distance measuring apparatus comprising:
a transceiver to transmit an electromagnetic wave signal or a sound wave signal and to receive the electromagnetic wave signal or the sound wave signal reflected by a target object;
time measuring circuitry to measure a time interval from transmission, by the transceiver, of the electromagnetic wave signal or the sound wave signal to reception, by the transceiver, of the reflected electromagnetic wave signal or the reflected sound wave signal; and
a distance measurer to measure a distance to the target object based on the time interval measured by the time measuring circuitry, wherein the time measuring circuitry comprises:
a ring oscillator comprising a plurality of delay circuitries connected in a ring shape, the ring oscillator adjusting delay times of the plurality of delay circuitries based on an oscillation control signal to generate an oscillation signal;
a time-to-digital converter to quantize a phase of the oscillation signal at a transition timing of a reference signal;
phase synchronizing circuitry to generate the oscillation control signal based on an output signal of the time-to-digital converter so that a phase of the oscillation signal coincides with a phase of the reference signal;
a time measurer to measure the time interval based on the output signal of the time-to-digital converter; and
a phase randomizer to randomly shift the phase of the oscillation signal to be locked by the phase synchronizing circuitry.

11. The distance measuring apparatus of claim 10, wherein the phase randomizer randomly shifts the phase of the oscillation signal to be locked by the phase synchronizing circuitry, whenever the time measurer measures the time interval.

12. The distance measuring apparatus of claim 10, wherein the phase randomizer comprises a random number generator to generate a random number, wherein the phase synchronizing circuitry generates the oscillation control signal based on a signal acquired by randomizing the output signal of the time-to-digital converter with the random number.

13. The distance measuring apparatus of claim 12 further comprising:

a pulse generator to generate a pulse signal having a pulse height in accordance with a value of the random number: and an oscillation control randomizer to add an offset in accordance with the random number to the oscillation control signal based on the pulse signal, wherein the ring oscillator controls the phase of the oscillation signal based on the randomized oscillation control signal.

14. The distance measuring apparatus of claim 12, wherein the time-to-digital converter comprises:

a first hold circuitry train comprising a plurality of first hold circuitry to hold outputs of the plurality of delay circuitries in the ring oscillator in synchronism with the reference signal; and an encoder to encode a signal train held by the plurality of first hold circuitry, wherein the phase randomizer generates the oscillation control signal based on a signal acquired by randomizing an output signal of the encoder with the random number.

15. The distance measuring apparatus of claim 12, wherein the time measurer comprises:

a second hold circuitry train comprising a plurality of second hold circuitry to hold outputs of the plurality of delay circuitries in the ring oscillator in synchronism with a first input signal;

a third hold circuitry train comprising a plurality of third hold circuitry to hold the outputs of the plurality of delay circuitries in the ring oscillator in synchronism with a second input signal; and a time interval arithmetic unit to compute a difference between data acquired by encoding a signal train held by the plurality of second hold circuitry and data acquired by encoding a signal train held by the plurality of third hold circuitry, as the time interval.

16. The distance measuring apparatus of claim 15, wherein the first input signal is a signal in synchronism with the reference signal and the second input signal is a signal indicating completion of measurement of the time interval.

17. The distance measuring apparatus of claim 15 further comprising a trigger signal generator to generate a trigger signal in synchronism with an input timing of the second input signal,
   wherein the phase randomizer randomly varies the output signal of the time-to-digital converter in synchronism with a generation timing of the trigger signal.

18. The distance measuring apparatus of claim 15 further comprising a trigger signal generator to generate a trigger signal in synchronism with the reference signal,
   wherein the phase randomizer randomly varies the output signal of the time-to-digital converter in synchronism with a generation timing of the trigger signal.

\* \* \* \* \*